Figure 1:
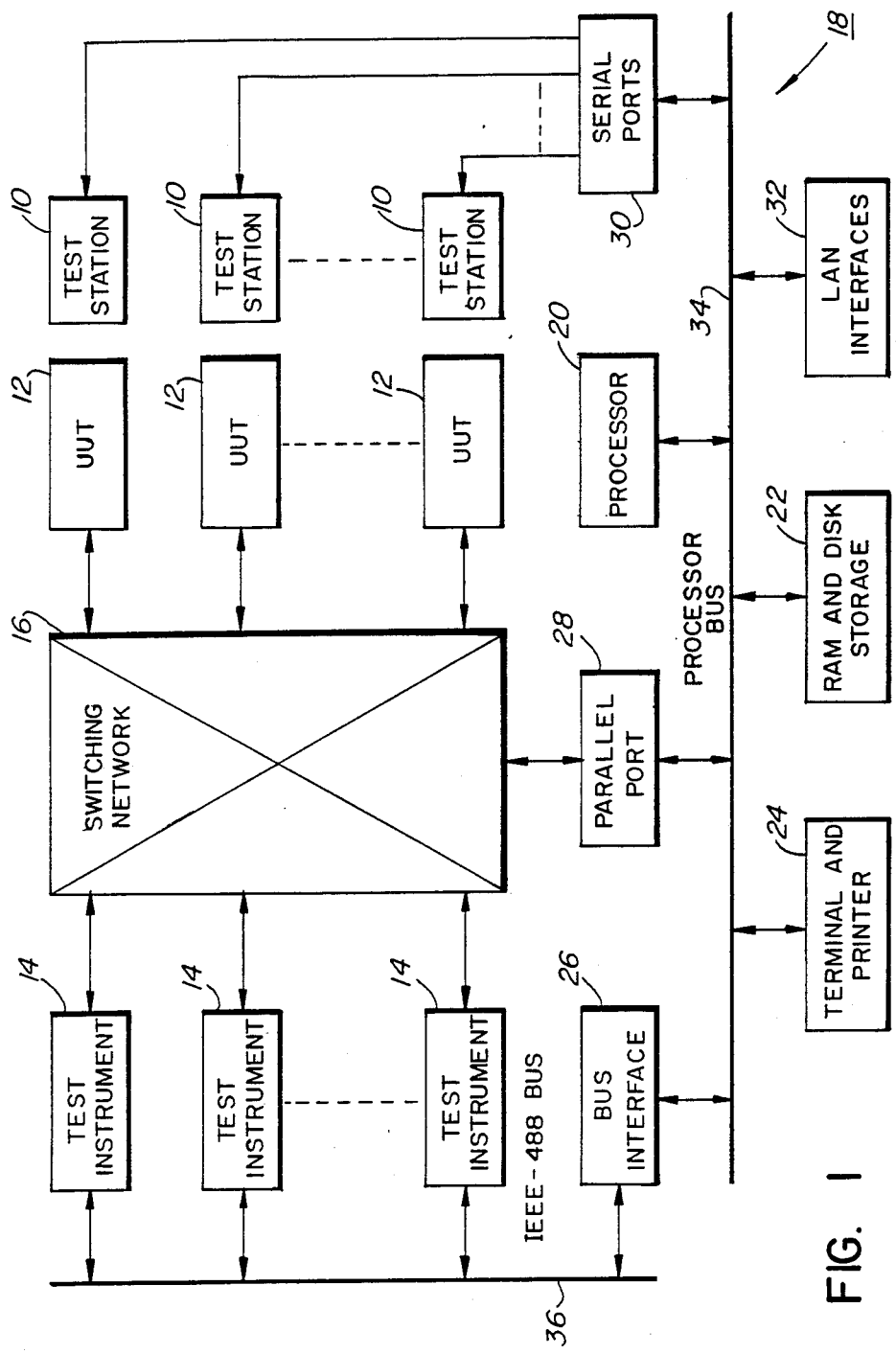

United States Patent [19]

Lias, Jr.

[11] Patent Number: 4,760,330
[45] Date of Patent: Jul. 26, 1988

[54] TEST SYSTEM WITH SHARED TEST INSTRUMENTS

[75] Inventor: Joseph L. Lias, Jr., Chamblee, Ga.

[73] Assignee: Northern Telecom Limited, Montreal, Canada

[21] Appl. No.: 871,450

[22] Filed: Jun. 6, 1986

[51] Int. Cl.[4] ............................................. G01R 31/28
[52] U.S. Cl. ..................................... 324/73 R; 371/20
[58] Field of Search ............ 324/73 R, 73 AT, 73 PC; 371/20, 25

[56] References Cited

U.S. PATENT DOCUMENTS

| | | | |
|---|---|---|---|
| 2,996,659 | 8/1961 | Haville | 324/73 AT |
| 4,196,386 | 4/1980 | Phelps | 324/73 PC |
| 4,216,539 | 8/1980 | Raymond et al. | 371/20 |
| 4,397,021 | 8/1983 | Lloyd et al. | 371/20 |
| 4,616,178 | 10/1986 | Thornton, Jr. et al. | 324/73 R |

Primary Examiner—Ernest F. Karlsen
Attorney, Agent, or Firm—Foley & Lardner, Schwartz, Jeffery, Schwaab, Mack, Blumenthal & Evans

[57] ABSTRACT

A plurality of units under test (UUTs) are coupled to a plurality of programmable test instruments via a switching network, whereby the test instruments are shared by test stations each associated with a respective UUT. The test stations communicate with a processor via respective serial ports to execute test programs for testing UUTs. The processor controls the switching network via a parallel port to set up desired connections, and programs the test instruments, via a bus interface and a bus to which all of the test instruments are coupled, for performing desired tests, in dependence upon the respective test program. The switching network is made up of switching modules. Each test station can include a bar code reader for reading information from the respective UUT.

6 Claims, 3 Drawing Sheets

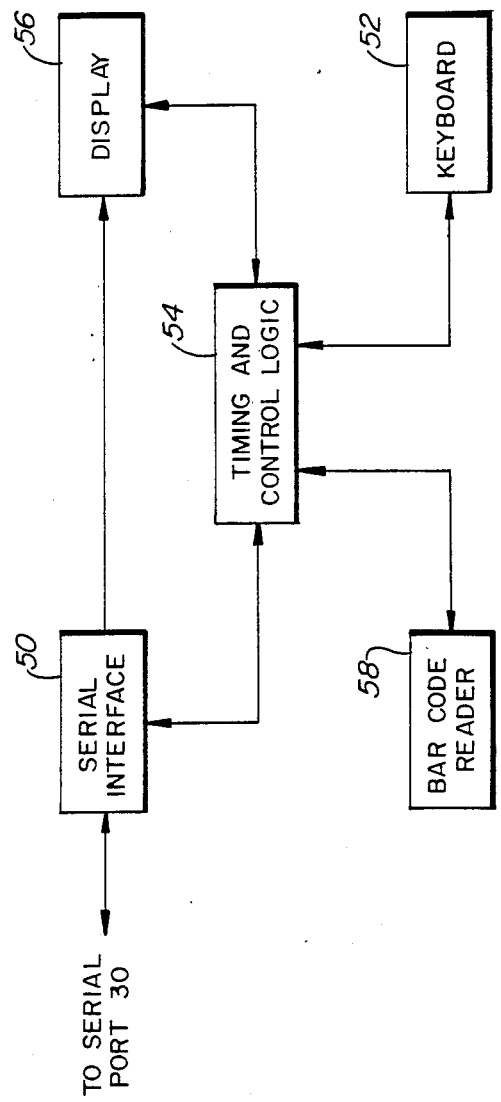

TEST SYSTEM WITH SHARED TEST INSTRUMENTS

This invention relates to test systems, and is particularly concerned with a test system in which test instruments are shared by a plurality of test stations.

It is well known that testing is an inherent part of product manufacturing, especially where the product comprises sophisticated electronic equipment. In order to facilitate testing of such products, it is also known to use programmable test instruments for performing test sequences automatically under software control provided by a processor. In such testing, it is also known to use a switching matrix for establishing required interconnections between each test instrument and the unit being tested, hereinafter referred to as the unit under test or UUT. Examples of such known test systems are described in Lloyd et al. U.S. Pat. No. 4,397,021 issued Aug. 2, 1983 and entitled "Multi-Processor Automatic Test System", and in Raymond et al. U.S. Pat. No. 4,216,539 issued Aug. 5, 1980 and entitled "In-Circuit Digital Tester".

In order to achieve a desired throughput of tested products, it is often necessary to provide a plurality of test stations, each of which is provided with the necessary test equipment for testing a specific product. For different products, different test stations often requiring functionally similar test instruments are separately provided. Examples of test instruments are stimulus devices, such as signal generators, and measurement devices, such as meters and signal analyzers. The costs of the test stations increase with increasingly complex and expensive test instruments being required for testing increasingly complex products. Furthermore, the collection of test data from such test stations and the need to maintain, and update testing procedures in, each test station individually are further disadvantages of known test systems.

Accordingly, an object of this invention is to provide an improved test system.

According to this invention there is provided a test system for simultaneous testing of a plurality of units under test (UUTs), comprising: a plurality of test stations each associated with a respective UUT; processing means for communicating with each test station to execute a test program; a plurality of programmable test instruments each coupled to the processing means to be programmed thereby; and switching means controlled by the processing means for coupling one or more test instruments to one or more UUTs; the test program for each UUT serving to program the respective test instrument(s) and to control the switching means to couple said test instrument(s) to the respective UUT for testing thereof.

The invention thus enables a plurality of test instruments to be shared among a plurality of UUTs and associated test stations, the switching means serving to set up and take down, under the control of test programs executed for the test stations by the processing means, connections between the test instruments and the UUTs for the desired testing thereof.

Preferably the switching means comprises a plurality of unit switching modules, each UUT being connected to at least one unit switching module, and at least one system switching module for selectively connecting at least one of the test instruments to at least one of the plurality of unit switching modules. Each switching module preferably comprises decoding means coupled via a parallel port to the processing means for controlling connections via the respective switching module. Thus the switching means can be built up in a modular fashion to accommodate arbitrary numbers of test instruments and UUTs.

Conveniently the test instruments are all connected to a common bus to which the processing means is coupled via a bus interface.

Each test station preferably comprises information entry means, information display means, control means, and serial interface means, each test station being coupled to the processing means via its serial interface means and a respective serial port for serial communications therewith. The information entry means of at least one test station preferably comprises means, such as a bar code reader, for reading information from the respective UUT.

The invention thus facilitates the provision of a test system in which test instruments can be expediently shared among a plurality of test stations, each of which can be operated by a relatively unskilled operator under the control of the respective test program, which can readily provide any necessary prompts and error messages to the operator via the display means of his test station.

Figure 2:
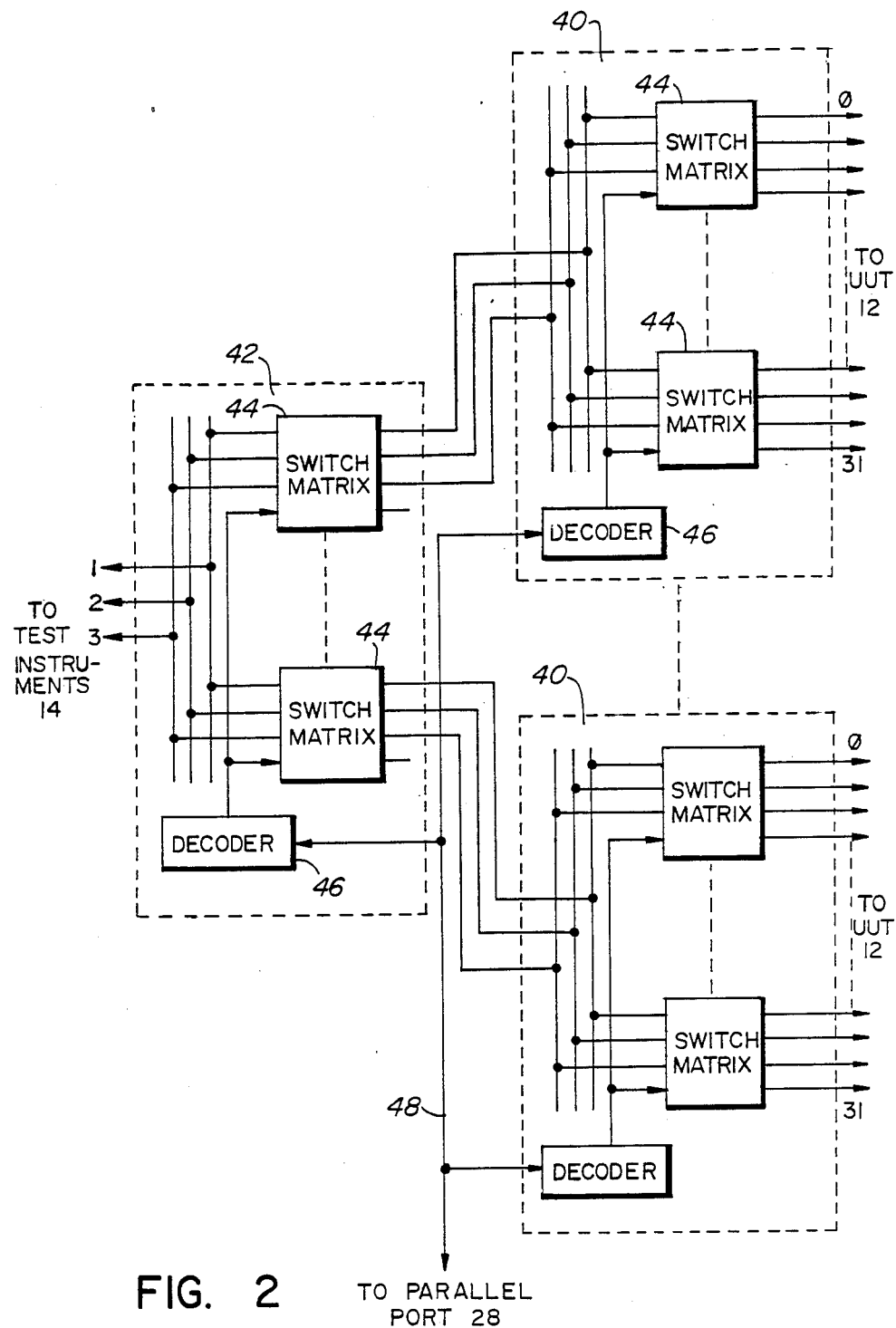

The invention will be further understood from the following description with reference to the accompanying drawings, in which:

FIG. 1 schematically illustrates in a block diagram a test system in accordance with the invention;

FIG. 2 schematically illustrates parts of a switching network of the system of FIG. 1; and FIG. 3 schematically illustrates parts of a test station of the system of FIG. 1.

Referring to FIG. 1, there is illustrated a test system in accordance with the invention, in which there is provided a plurality of test stations 10 each of which serves for testing a respective product, or UUT (unit under test) 12. The UUTs 12 may be the same or different for the different test stations 10, and each test station may serve for testing only one or various different types of UUT. FIG. 1 illustrates by way of example three test stations 10 and associated UUTs 12, but there may be an arbitrary number.

Each UUT 12 is tested using one or more of a plurality of programmable test instruments 14 which collectively constitute a pool of test instruments. Again, by way of example, three test instruments 14 are illustrated in FIG. 1 but an arbitrary number may be provided. The test instruments 14 comprise both stimulus devices, such as signal generators, and measurement devices, such as multimeters and signal analyzers, which may be useful in performing various desired tests on the UUTs. The test instruments 14 may all be different, or a plurality of test instruments of one or more types may be provided, as desired.

The test instruments 14 and UUTs 12 are interconnected, for performing desired tests, via a switching network 16 which is described in greater detail below. The interconnections are established under the control of a test system controller generally referenced 18. The controller 18 comprises a micro-processor 20, associated RAM (random access memory) and disk storage 22, at least one associated terminal and printer 24, an IEEE-488 bus interface 26, a parallel port 28, serial ports 30, and optional LAN (local area network) interfaces 32, all of which are interconnected via a processor bus 34.

The bus interface 26 and each of the test instruments 14 are coupled together via an IEEE-488 bus 36, whereby the processor 20 can communicate with each test instrument 14 in order to program it in a desired manner for performing a particular test. Interconnections via the switching network 16 are set up under the control of the processor 20 via the parallel port 28. In addition, each test station 10 communicates with the processor 20 via a respective one of the serial ports 30, for example via an RS-232C interface and at a bit rate of 19.2 kb/s.

Before the test system is further described, one form of the switching network 16 and a test station 10 are described with reference to FIGS. 2 and 3 respectively.

FIG. 2 illustrates parts of a switching network 16 which serves for connecting up to three test instruments 14 to up to eight UUTs 12 in a time-shared manner. These numbers and this configuration of switching network are chosen by way of example for clarity and simplicity of description, and other sizes and configurations of the switching network may be provided as described below.

The switching network of FIG. 2 comprises nine similar switching modules, constituted by eight unit switching modules 40 only two of which are shown for clarity, and a system switching module 42. Each switching module 40 or 42 comprises eight switch matrices 44, only two of which are shown in each switching module, and a decoder 46 which serves to control connections in these switch matrices 44 in dependence upon a control signal supplied by the processor 20 via the parallel port 28, to which all of the decoders 46 are coupled via a bus 48.

Each switch matrix 44 has three inputs and four outputs, and serves for connecting each of the three inputs selectively to none or one or more of the outputs. For example, each switch matrix 44 can comprise four switch elements, one in respect of each of the four outputs, addressable with two bits of the control signal on the bus 48, each element comprising relays for selectively connecting the respective output to one of the three inputs, or for isolating the respective output from the inputs, in dependence upon a further two bits of the control signal. A further eight bits of the control signal on the bus 48, which is for example a 12-bit wide parallel data bus, can be used to address any one of 256 switching modules 40, 42 as described below.

As illustrated in FIG. 2, the three inputs of the system switching module 42 are coupled each to a respective one of the three test instruments 14, represented by the references 1 to 3 in FIG. 2. These three inputs are connected within the system switching module 42 in parallel to the three inputs of each switch matrix 44. Of the four outputs of each of the eight switch matrices 44 in the system switching module 42, one is unused and the other three are connected to the three inputs of a respective one of the eight unit switching modules 40. Thus the system switching module 42 enables connections to be established between the test instruments 14 and any of the unit switching modules 40.

Each UUT 12 is coupled to at least one unit switching module 40. More particularly, the four outputs of each of the eight switch matrices 44 in each unit switching module 40 provide a total of 32 outputs, referenced 0 to 31 in FIG. 2, which are connected to test points on the respective UUT 12. Each UUT 12 can thus have up to 32 test points, which can be selectively connected to or isolated from the test instruments 14, for each unit switching module 40 to which it is connected. The three inputs of all of the switch matrices 44 in each unit switching module 40 are connected respectively in parallel, as in the system switching module 42, whereby any of the three inputs, and hence any of the three test instruments 14, can be coupled to any of the outputs.

Although for clarity and simplicity FIG. 2 shows only one connection for each input and each output, in practice each of these comprises a two-wire connection. Furthermore, although the above description refers to inputs and outputs, the paths through the switching network are bidirectional so that test signals can be arbitrarily supplied by the test instruments 14 to the UUTs 12 and received by the test instruments 14 from the UUTs 12.

The above description and the illustration in FIG. 2 relate to a relatively simple switching network 16 for coupling up to eight UUTs 12 to up to three test instruments 14, using nine similar switching modules. With an 8-bit address as described above, the switching network 16 can comprise multiple arrangements each as illustrated in FIG. 2, for establishing connections between greater numbers of test instruments 14 and/or UUTs 12. More particularly, the 256 distinct decoder addresses available from the 8-bit address could be used for addressing 29 (256 addresses divided by 9 modules per arrangement as in FIG. 2, rounded up) system switching modules 42 and 227 unit switching modules 40 (e.g. 8 coupled to each of 28 system switching modules, and 3 coupled to the 29th system switching module). Within these limits constrained by the size of the switching network 16, arbitrary numbers and combinations of test instruments 14 can be provided for connection to arbitrary numbers of UUTs 12 with arbitrary numbers of test points.

Thus it should be appreciated that the description given here is simply by way of example for providing a full understanding of an implementation of the invention, and that the switching network 16 may be readily expanded to provide for greater numbers of UUTs and test instruments, and that other forms of switching network 16 may equally well be provided.

FIG. 3 illustrates parts of a test station 10, which essentially comprises a 'dumb' terminal. As shown in FIG. 3, each test station comprises a serial interface 50 for communicating with the processor 20 via the respective serial port 30, a keyboard 52, timing and control logic 54, and a display 56. The display 56 is for example a two-line liquid crystal display, one line of which serves for displaying operator prompts, instructions, or test results supplied by the processor 20, and the other line of which serves for displaying commands or responses entered by an operator via the keyboard 52.

In addition, as shown in FIG. 3 the test station 10 may include a bar code reader 58, which may be used by an operator in response to a supplied prompt to read a bar code on the respective UUT 12. Such a bar code may be used to identify a particular type or category of product being tested, or to identify to the processor 20 any other desired characteristic of the UUT 12.

Referring again to FIG. 1, the manner in which the test system is used in testing UUTs is described below.

The processor 20 is for example a Motorola 68000 microprocessor running under a multi-user, multi-tasking operating system such as OS-9 (Trade Mark) stored in the RAM and disk storage 22. Via the terminal 24, test program modules, as desired for performing particular test sequences on particular UUTs 12 using particular test instruments 14, can be entered (and changed) and saved in the storage 22. The test program modules are written using re-entrant coding, so that each module can be contemporaneously (i.e. sequentially in respective processor time slices), used by an arbitrary number of test stations 10 for simultaneous testing of a corresponding number of UUTs 12. In this respect it should be appreciated that the following description relates to only a single task, i.e. to operations in respect of a single test station 10, and that similar operations occur contemporaneously in respect of an arbitrary number of tasks or test stations 10.

In order to perform testing, an operator logs on to the test system at one of the test stations and is supplied with a prompt from the processor 20, which is displayed on the display 56. This prompt may be to connect a unit to be tested to an appropriate connector, and to enter via the keyboard 52 an identification of the unit, or to supply such an identification from the unit itself by scanning a bar code on the unit using the bar code reader 58. In response to this identification, the processor 20 executes the particular desired test program which is saved in the storage 22.

Generally, the test program provides a sequence of prompts, which are communicated to the operator via the respective serial port 30, interface 50, and display 52 as described above, and tests which require one or more test instruments 14 to be programmed and connected to the respective UUT 12 via the switching network 16, the test results being communicated to the operator in the same manner as prompts and also optionally being saved in the storage 22 for subsequent analysis and statistical reports via the terminal and printer 24. In addition, test results can be used interactively for quality control and/or product tracking purposes via one or more local area networks to which the processor 20 is linked via the LAN interfaces 32.

In order to effect a particular test sequence in a test program, the program, which is also referred to as a test process, initially requests use of each test instrument 14 which is required. In order to avoid a deadlocked situation in which two different test processes each request use of a test instrument which is already held for use by the other, the test instruments are requested and assigned only in accordance with a linear (e.g. numerical) order. Thus if a test process has been allocated a test instrument 14 of a given type, it may subsequently request use of only those test instruments which are included later in this order.

The requests for test instruments are queued by the operating system in a manner which is transparent to the operator, until they are satisfied and the necessary test instruments are allocated for use by the respective test process. During this allocation the operating system, and more particularly a system switching module resource manager thereof, controls the respective system switching module(s) 42 of the switching network 16, by means of a control signal supplied via the parallel port 28 as described above, to make physical desired connections between the allocated test instrument(s) 14 and respective ones of the inputs of the unit switching module(s) 40 connected to the respective UUT 12.

In a similar manner, the test process then establishes via the respective unit switch module(s) 40 any desired connections, in any arbitrary combination which may be required, between the test instruments connected to the inputs of each such unit switching module and the 32 wire pair outputs of this switch module which are connected to the respective UUT 12. In addition, for setting up or programming the allocated test instruments 14 for performing particular tests, and for deriving the results of tests from the allocated test instruments 14, in each case the test process requests access to the IEEE-488 bus 36, which bus is shared for all communications between the processor 20 and the test instruments 14, performs the necessary input to and/or output from the respective test instruments when this request is granted, and then releases the bus 36. The test process effects any necessary communications during the testing with the respective test station 10 via the respective serial port 30 as already described.

On completion of a test sequence, the test process releases the test instruments which it has been allocated, so that they can be used by other test processes in association with other test stations.

From the above description it should be appreciated that, although the system switching modules 42 and the unit switching modules 40 are electrically and physically identical, except for having distinct addresses decoded in the decoders 46, they perform different logical functions. In particular, the system switching modules 42 are under the direct control of the operating system's system switching module resource manager and are not directly accessible by any individual test process, whereas each test process does have direct control over, and can establish any desired switching combination in, the respective unit switching modules 40.

Whilst the above description relates to a particular embodiment of the invention, it should be appreciated that the invention is not limited to this, and many modifications, variations, and adaptations may be made without departing from the scope of the invention as defined in the claims. In particular, it is observed that the invention is not limited to the particular type of switching network described, or in respect of the numbers of test instruments and test stations which may be provided.

What is claimed is:

1. A test system for simultaneous testing of a plurality of units under test (UUTs), comprising:
   a plurality of test stations each associated with a respective UUT;
   processing means for communicating with each test station to execute a test program;
   a plurality of programmable test instruments each coupled to the processing means to be programmed thereby; and
   switching means controlled by the processing means for coupling at least one test instrument to a plurality of UUTs;
   the test program for the UUTs serving to program the respective test instrument(s) and to control the switching means to couple said test instrument(s) to the respective UUTs for simultaneous testing thereof.

2. A test system as claimed in claim 1 wherein the switching means comprises a plurality of unit switching modules, each UUT being connected to at least one unit switching module, and at least one system switching module for selectively connecting at least one of the test instruments to at least one of the plurality of unit switching modules.

3. A test system as claimed in claim 2 wherein each switching module comprises decoding means coupled via a parallel port to the processing means for controlling connections via the respective switching module.

4. A test system as claimed in claim 1 wherein the test instruments are all connected to a common bus to which the processing means is coupled via a bus interface.

5. A test system as claimed in claim 1 wherein each test station comprises information entry means, information display means, control means, and serial interface means, each test station being coupled to the processing means via its serial interface means and a respective serial port for serial communications therewith.

6. A test system as claimed in claim 5 wherein the information entry means of at least one test station comprises means for reading information from the respective UUT.

* * * * *